United States Patent
Akimaru et al.

(10) Patent No.: US 10,095,110 B2
(45) Date of Patent: Oct. 9, 2018

(54) PHOTOSENSITIVE RESIN COMPOSITION, METHOD FOR FORMING RESIST PATTERN, AND METHOD FOR PRODUCING METALLIC PATTERN

(71) Applicant: JSR CORPORATION, Tokyo (JP)

(72) Inventors: Hisanori Akimaru, Tokyo (JP); Kenji Okamoto, Tokyo (JP); Hirokazu Sakakibara, Tokyo (JP); Makoto Katsurayama, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/361,010

(22) Filed: Nov. 24, 2016

(65) Prior Publication Data
US 2017/0153543 A1 Jun. 1, 2017

(30) Foreign Application Priority Data

Nov. 26, 2015 (JP) .................... 2015-230544
Sep. 9, 2016 (JP) .................... 2016-176329

(51) Int. Cl.
G03F 7/30 (2006.01)
G03F 7/031 (2006.01)
G03F 7/027 (2006.01)
G03F 7/033 (2006.01)
G03F 7/32 (2006.01)

(52) U.S. Cl.
CPC .............. *G03F 7/031* (2013.01); *G03F 7/027* (2013.01); *G03F 7/033* (2013.01); *G03F 7/30* (2013.01); *G03F 7/322* (2013.01)

(58) Field of Classification Search
CPC .......... G03F 7/027; G03F 7/031; G03F 7/033; G03F 7/30; G03F 7/322
USPC .................... 430/281.1, 288.1, 325
See application file for complete search history.

(56) References Cited

U.S. PATENT DOCUMENTS

| | | | | |
|---|---|---|---|---|
| 5,019,482 A * | 5/1991 | Ai | ................ | G03F 7/031 430/281.1 |
| 8,999,631 B2 * | 4/2015 | Senzaki | .............. | C08L 53/00 430/271.1 |
| 2002/0164542 A1 * | 11/2002 | Oshio | .............. | G03F 7/0007 430/270.1 |
| 2008/0085458 A1 | 4/2008 | Yamato et al. | | |
| 2009/0087759 A1 | 4/2009 | Matsumoto et al. | | |
| 2009/0176337 A1 * | 7/2009 | Kang | ................ | G03F 7/0007 438/151 |
| 2010/0188765 A1 | 7/2010 | Matsumoto et al. | | |
| 2011/0129778 A1 | 6/2011 | Murata et al. | | |
| 2012/0176571 A1 * | 7/2012 | Makino | ............... | C07D 209/82 349/106 |

FOREIGN PATENT DOCUMENTS

| | | |
|---|---|---|
| JP | 2008506749 | 3/2008 |
| JP | 2009519904 | 5/2009 |
| JP | 2009519991 | 5/2009 |
| JP | 2010152155 | 7/2010 |
| JP | 2011132215 | 7/2011 |
| WO | 2010146883 | 12/2010 |

* cited by examiner

*Primary Examiner* — John S Chu
(74) *Attorney, Agent, or Firm* — JCIPRNET

(57) ABSTRACT

The present invention provides a photosensitive resin composition including: an alkali-soluble resin (A) having more than 30% by mass and less than 70% by mass of a structural unit represented by the Formula (1) below; a compound (B) having at least one ethylenically unsaturated double bond per molecule; and a photo radical polymerization initiator (C) having an oxime ester structure; wherein a content of the photo radical polymerization initiator (C) with respect to 100 parts by mass of the alkali-soluble resin (A) is 3 to 20 parts by mass. In Formula (1), $R^1$ represents a hydrogen atom or a $C_{1-4}$ alkyl group. $R^2$ represents a single bond or a divalent organic group. $R^3$ each independently represent a hydrogen atom, a hydroxyl group, or an optionally substituted alkyl group.

[Formula (1)]

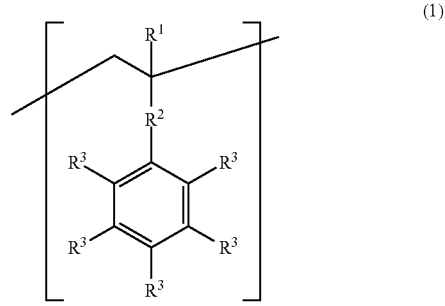

(1)

5 Claims, No Drawings

PHOTOSENSITIVE RESIN COMPOSITION, METHOD FOR FORMING RESIST PATTERN, AND METHOD FOR PRODUCING METALLIC PATTERN

CROSS-REFERENCE TO RELATED APPLICATIONS

This application claims the priority benefit of Japanese application serial no. 2015-230544, filed on Nov. 26, 2015 and Japanese application serial no. 2016-176329, filed on Sep. 9, 2016. The entirety of the above-mentioned patent application is hereby incorporated by reference herein and made a part of this specification.

TECHNICAL FIELD

The present invention relates to a photosensitive resin composition, a method for forming a resist pattern, and a method for producing a metallic pattern.

BACKGROUND ART

In recent years, there has been an increase in need for high density mounting of wires of a semiconductor element and a display element of a liquid crystal display, a touch panel, and the like as well as high density mounting of connection terminals such as bumps. Therefore, the miniaturization of the wires and the connection terminals is accelerating to allow high density mounting. Consequently, a resist pattern used in formation of the wires, the bumps, or the like has been required to be miniaturized.

Generally, the wires, the bumps, and the like are formed by forming a resist pattern on a substrate having a metallic foil such as a copper foil and then using the thus obtained resist pattern as a mask for performing plating, etching, or the like. The resist pattern is generally formed by applying a photosensitive resin composition to the substrate and then exposing and developing the resin coating. As the photosensitive resin composition, a radical negative-type photosensitive resin composition containing a photo-radical initiator is commonly used. In the photosensitive resin composition, radicals act as active species. Thus, improvement of the pattern resolution is limited because of inhibition by oxygen contained in the air. In particular, miniaturizing of the resist pattern causes a problem that the top of the obtained resist pattern is rounded and a resist pattern having a rectangular cross section cannot be obtained, resulting in deterioration of resolution.

In addition, in cases where the resist pattern is miniaturized, the contact area between the resist pattern and the metallic foil becomes narrow. Thus, insufficiency of adhesiveness between the resist pattern and the metallic foil can cause a problem that the resist pattern collapses.

In Patent Document 1, as a composition providing a resin pattern which demonstrates favorable adhesiveness to a metallic film, a photosensitive resin composition comprising an alkali-soluble resin produced by a reaction between an acid radical-containing acrylic resin and an alicyclic epoxy group-containing unsaturated compound (A); a polyfunctional monomer having three or more functional groups (B); a nitrogen-containing monofunctional monomer (C); and a photo polymerization initiator (D) is disclosed. However, under the miniaturization of the resist pattern, it is difficult for even the resin pattern obtained from this composition to ensure favorable adhesiveness to the metallic film.

PRIOR ART DOCUMENT

Patent Document

[Patent Document 1] JP 2010-152155 A

SUMMARY OF THE INVENTION

The present invention provides a photosensitive resin composition, which allows formation of a resist pattern having a rectangular cross section and further allows formation of a resist pattern having excellent adhesiveness.

The photosensitive resin composition of the present invention comprises: an alkali-soluble resin(A) having more than 30% by mass and less than 70% by mass of a structural unit represented by Formula (1) below; a compound (B) having at least one ethylenically unsaturated double bond per molecule; and a photo radical polymerization initiator (C) having an oxime ester structure, and a content of the photo radical polymerization initiator (C) with respect to 100 parts by mass of the alkali-soluble resin (A) is 3 to 20 parts by mass.

[Formula (1)]

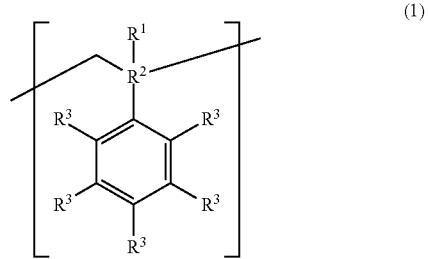

In Formula (1), $R^1$ represents a hydrogen atom or a $C_{1-4}$ alkyl group. $R^2$ represents a single bond or a divalent organic group. $R^3$ each independently represent a hydrogen atom, a hydroxyl group, or an optionally substituted alkyl group. In the photosensitive resin composition, $R^2$ in Formula (1) is preferably a single bond.

In the photosensitive resin composition, the oxime ester structure is preferably a structure represented by Formula (2) below.

[Formula (2)]

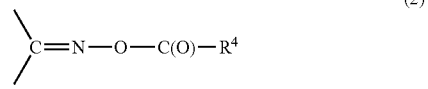

In Formula (2), $R^4$ represents an optionally substituted alkyl group or an optionally substituted aryl group.

The method for forming a resist pattern of the present invention comprises the steps of: (1) applying the photosensitive resin composition to a base material to form a resin coating; (2) exposing the resin coating; and (3) developing the exposed resin coating using an alkaline developer to allow pattern formation.

In the method for producing a metallic pattern of the present invention, the resist pattern formed by the method for forming a resist pattern is used as a mask to produce the metallic pattern.

The photosensitive resin composition of the present invention allows formation of a resist pattern having a rectangular cross section and formation of a resist pattern having excellent adhesiveness.

DESCRIPTION OF THE EMBODIMENTS

[Photosensitive Resin Composition]

The photosensitive resin composition of the present invention comprises: an alkali-soluble resin(A) having more than 30% by mass and less than 70% by mass of a structural unit represented by Formula (1) below; a compound (B) having at least one ethylenically unsaturated double bond per molecule; and a photo radical polymerization initiator (C) having an oxime ester structure, and a content of the photo radical polymerization initiator (C) with respect to 100 parts by mass of the alkali-soluble resin (A) is 3 to 20 parts by mass.

[Formula (1)]

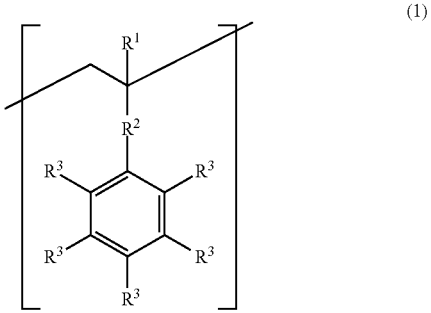

In Formula (1), $R^1$ represents a hydrogen atom or a $C_{1-4}$ alkyl group. $R^2$ represents a single bond or a divalent organic group. $R^3$ each independently represent a hydrogen atom, a hydroxyl group, or an optionally substituted alkyl group.

In conventional radical negative-type photosensitive resin compositions containing a photo-radical initiator, the action of radicals as active species is inhibited by oxygen in the air, resulting in occurrence of a phenomena such as rounding of the top of the obtained resist pattern. Thus, those compositions allow only limited improvement of the pattern resolution. The phenomenon of rounding of the top of the resist pattern is remarkable in cases where the resist pattern is fine and composed of a thin film.

The photosensitive resin composition of the present invention contains, as a photo radical polymerization initiator, a high concentration of a photo radical polymerization initiator having an oxime ester structure (C) which generates a large amount of various active species. As a result, the inhibition by oxygen in the air is suppressed.

On the other hand, since active species generated from an oxime ester-based photo radical initiator contain highly reactive active species such as methyl radicals, patterning by exposure of a resin coating obtained by application of a photosensitive resin composition containing the photo radical initiator allows the highly reactive active species to influence also unexposed portions, resulting in difficulty in resolving the pattern in some cases. One possible solution to this problem is inclusion of a high concentration of a polymerization inhibitor (quencher) to capture the highly reactive species. However, conventionally and commonly used polymerization inhibitors easily sublimate, and it is therefore assumed that their capacities to capture active species are saturated by inclusion of certain amounts of the inhibitors, resulting in insufficient effects. On the other hand, polymerization inhibitors having large molecular structures that are less likely to sublimate have low capacities to capture active species, and therefore sufficient resolution of the pattern cannot be achieved therewith.

The alkali-soluble resin (A) in the photosensitive resin composition of the present invention has more than 30% by mass and less than 70% by mass of a structural unit represented by the Formula (1). In short, the alkali-soluble resin (A) has a large amount of phenolic hydroxyl group. It is known that a phenolic hydroxyl group captures radical active species. Therefore, in the photosensitive resin composition of the present invention, the alkali-soluble resin (A) can act as a polymerization inhibitor, capture the active species having long diffusion lengths, and solve the problem of difficulty in resolving the pattern due to use of an oxime ester-based photo radical initiator.

That is, a high concentration of the photo radical polymerization initiator (C) having an oxime ester structure contained in the photosensitive resin composition of the present invention suppresses the inhibition by oxygen in the air, and further inclusion of the alkali-soluble resin (A) having a large amount of phenolic hydroxyl group in the composition overcomes disadvantages that may occur due to the inclusion of the photo radical polymerization initiator (C). As a result, the photosensitive resin composition of the present invention allows formation of a resist pattern having excellent resolution, more specifically, formation of a resist pattern having a rectangular cross section whose top is not rounded.

In addition, the photosensitive resin composition of the present invention comprises the alkali-soluble resin (A) having a large amount of phenolic hydroxyl group, thereby having an effect on improvement of the adhesiveness between the obtained resist pattern and copper.

The photosensitive resin composition of the present invention is concretely described below.

The photosensitive resin composition of the present invention comprises an alkali-soluble resin (A) having more than 30% by mass and less than 70% by mass of a structural unit represented by the Formula (1); a compound (B) having at least one ethylenically unsaturated double bond per molecule; and a photo radical polymerization initiator (C) having an oxime ester structure, and the composition can further comprise photo radical polymerization initiators other than the photo radical polymerization initiator (C) and other components if necessary.

In the following descriptions, examples of substituents include $C_{3-20}$ cycloalkyl, $C_{6-18}$ aryl, $C_{1-20}$ alkoxy, hydroxy, and nitro groups, and halogen atoms such as fluorine, chlorine, and iodine.

[Alkali-Soluble Resin (A)]

The alkali-soluble resin (A) is a resin that is soluble in an alkaline developer to an extent at which the processing of interest is possible.

The alkali-soluble resin (A) has more than 30% by mass and less than 70% by mass, preferably 35 to 65% by mass, more preferably 40 to 60% by mass, still more preferably 45 to 55% by mass of a structural unit represented by Formula (1). As described above, since the alkali-soluble resin (A) has a structural unit represented by Formula (1) within this range, the alkali-soluble resin (A) allows formation of a resist pattern having a rectangular cross section and excellent adhesiveness to copper.

In Formula (1), $R^1$ is a hydrogen atom or a $C_{1-4}$ alkyl group, preferably methyl group.

$R^2$ is a single bond or a divalent organic group.

Examples of the divalent organic group include a $C_{1-20}$ alkanediyl group, $C_{6-30}$ arylene group, —COO—, —CONH—, and —$R^5$—Ar—OCO— ($R^5$ is a branched or nonbranched $C_{1-20}$ alkanediyl group, and Ar is an arylene group optionally substituted with alkyl group(s)).

Examples of the alkanediyl group include a methylene group, ethylene group, propane-1,2-diyl group, propane-2,2-diyl group, and propane-1,3-diyl group.

Examples of the arylene group include a phenylene group, and naphthalenediyl group.

Preferably, $R^2$ is a single bond, i.e., the hydroxyphenyl group in Formula (1) is singly bounded directly to a carbon atom of the polymer chain constituting the alkali-soluble resin.

$R^3$ each independently represent a hydrogen atom, a hydroxyl group, or an optionally substituted alkyl group. Examples of the alkyl group include a methyl group, ethyl group, and propyl group. Each of $R^3$ is preferably a hydrogen atom or a hydroxyl group. Preferably, at least one of $R^3$ is a hydroxyl group. More preferably, one of $R^3$ is a hydroxyl group and the others are hydrogen atoms.

The weight average molecular weight (Mw) of the polymer constituting the alkali-soluble resin (A) in terms of polystyrene as determined by gel permeation chromatography is within the range of usually 1,000 to 1,000,000 g/mol, preferably 2,000 to 50,000 g/mol, more preferably 3,000 to 20,000 g/mol.

The resin having a structural unit represented by Formula (1) can be obtained by performing copolymerization of a hydroxyl-containing aromatic vinyl compound that is capable of inducing a structural unit represented by Formula (1) (hereinafter referred to as the "monomer (A)") and another type of monomer that is copolymerizable with the monomer (A) (hereinafter referred to as the "monomer (I)"). Provided, however, that the resin having a large amount of phenolic hydroxyl group such as the alkali-soluble resin (A) is usually synthesized by performing copolymerization of a monomer that is formed by binding of a protecting group to a phenolic hydroxyl group of the monomer (A) (hereinafter referred to as the "monomer (A')") and a monomer (I) and transforming the protecting groups of the thus obtained copolymer into phenolic hydroxyl groups.

Examples of the monomer (A) include o-hydroxystyrene, m-hydroxystyrene, p-hydroxystyrene, p-isopropenylphenol, and 2-tert-butyl-6-(3-tert-butyl-2-hydroxy-5-methylbenzyl)-4-meth ylphenyl acrylate.

Examples of the monomer (A') include a compound that can be obtained by reacting a phenolic hydroxyl group of the monomer (A) with acetic acid and the like. Among these monomers, the compound that can be obtained by reacting a phenolic hydroxyl group of p-hydroxystyrene or p-isopropenylphenol with acetic acid is preferred from the viewpoint of obtaining a resin composition that allows formation of a resist pattern having excellent resistance to a long plating process. The compound that can be obtained by reacting a phenolic hydroxyl group of p-isopropenylacetoxybenzene with acetic acid is more preferable.

Examples of the monomer (I) include aromatic vinyl compounds such as styrene, α-methylstyrene, p-methylstyrene, and p-methoxystyrene; heteroatom-containing alicyclic vinyl compounds such as N-vinylpyrrolidone and N-vinylcaprolactam; (meth)acrylic acid derivatives having a glycol structure, such as phenoxydiethylene glycol (meth)acrylate, phenoxytriethylene glycol (meth)acrylate, phenoxytetraethylene glycol (meth)acrylate, phenoxypolyethylene glycol (meth)acrylate, phenoxydipropylene glycol (meth)acrylate, phenoxytripropylene glycol (meth)acrylate, phenoxytetrapropylene glycol (meth)acrylate, lauroxydiethylene glycol (meth)acrylate, lauroxytriethylene glycol (meth)acrylate, lauroxytetraethylene glycol (meth)acrylate, lauroxydipropylene glycol (meth)acrylate, lauroxytripropylene glycol (meth)acrylate, and lauroxytetrapropylene glycol (meth)acrylate; cyano-containing vinyl compounds such as acrylonitrile and methacrylonitrile; conjugated diolefins such as 1,3-butadiene and isoprene; carboxyl-containing vinyl compounds such as acrylic acid and methacrylic acid; (meth)acrylic esters such as methyl (meth)acrylate, ethyl (meth)acrylate, n-propyl (meth)acrylate, n-butyl (meth)acrylate, 2-hydroxyethyl (meth)acrylate, 2-hydroxypropyl (meth)acrylate, polyethylene glycol mono(meth)acrylate, polypropylene glycol mono(meth)acrylate, glycerol mono(meth)acrylate, phenyl (meth)acrylate, benzyl (meth)acrylate, cyclohexyl (meth)acrylate, isobornyl (meth)acrylate, and tricyclodecanyl (meth)acrylate; and p-hydroxyphenyl (meth)acrylamide.

Among these monomers (I), styrene, acrylic acid, methacrylic acid, methyl (meth)acrylate, ethyl (meth)acrylate, n-butyl (meth)acrylate, tricyclodecanyl (meth)acrylate, benzyl (meth)acrylate, isobornyl (meth)acrylate, p-hydroxyphenyl (meth)acrylamide, and the like are preferred.

As the monomer (A') and the monomer (I), these compounds may be respectively used singly, or in combination of two or more kinds thereof.

Examples of the copolymerization of the monomer (A') and the monomer (I) include radical polymerization. Examples of the method for the polymerization include emulsion polymerization, suspension polymerization, solution polymerization, and bulk polymerization.

The alkali-soluble resin (A) can be obtained by hydrolysing the copolymer obtained by the copolymerization of the monomer (A') and the monomer (I) using, for example, hydrochloric acid to remove protecting groups and regenerate phenolic hydroxyl groups.

Although the phenolic hydroxyl group in the structural unit represented by Formula (1) may have a quinone structure in the photosensitive resin composition of the present application, the structural unit represented by Formula (1) comprises the quinone structure in the claimed invention.

[Compound Having at Least One Ethylenically Unsaturated Double Bond Per Molecule (B)]

The compound (B) is a component that undergoes radical polymerization by active species generated from the photo radical polymerization initiator during the exposure, and has at least one ethylenically unsaturated double bond per molecule.

The compound (B) is preferably a (meth)acrylate compound having a (meth)acryloyl group, or a compound having a vinyl group. The (meth)acrylate compounds can be classified into monofunctional (meth)acrylate compounds and polyfunctional (meth)acrylate compounds. The compound (B) may be either of these compounds.

Examples of the monofunctional (meth)acrylate compounds include 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, isobutyl (meth)acrylate, tert-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecylamyl (meth)acrylate, lauryl (meth)acrylate, octadecyl (meth)acrylate, stearyl (meth)acrylate, tetrahydrofurfuryl (meth)acrylate, benzyl (meth)acrylate, phenoxyethyl (meth)acrylate, ethoxyethyl (meth)acrylate, butoxyethyl (meth)acrylate, glycerol (meth)acrylate, ethylene glycol monomethyl ether (meth)acrylate, ethylene glycol monoethyl ether (meth)acrylate, polyethylene glycol mono(meth)acrylate, polypropylene glycol mono(meth)acrylate, methoxyethylene glycol (meth)acrylate, ethoxydiethylene glycol (meth)acrylate, methoxypolyethylene glycol (meth)acrylate, methoxypolypropylene glycol (meth)acrylate, phenoxypolyethylene glycol (meth)acrylate, phenoxypolypropylene glycol (meth)acrylate, tricyclo [5.2.1.0$^{2,6}$] decadienyl (meth)acrylate, tricyclo [5.2.1.0$^{2,6}$] decanyl (meth)acrylate, tricyclo [5.2.1.0$^{2,6}$] decenyl (meth)acrylate, isobornyl (meth)acrylate, bornyl (meth)acrylate, cyclohexyl (meth)acrylate, acrylic acid amide, methacrylic acid amide, diacetone (meth)acrylamide, isobutoxymethyl (meth)acrylamide, N,N-dimethyl (meth)acrylamide, tert-octyl (meth)acrylamide, dimethylaminoethyl (meth)acrylate, diethylaminoethyl (meth)acrylate, and 7-amino-3,7-dimethyloctyl (meth)acrylate.

Examples of the polyfunctional (meth)acrylate compounds include trimethylolpropane di(meth)acrylate, trimethylolpropane tri(meth)acrylate, trimethylolpropane PO (propylene oxide)-denatured tri(meth)acrylate, tetramethylolpropane tetra(meth)acrylate, ethylene glycol di(meth)acrylate, tetraethylene glycol di(meth)acrylate, polyethylene glycol di(meth)acrylate, 1,4-butanediol di(meth)acrylate, 1,6-hexanediol di(meth)acrylate, propylene glycol di(meth)acrylate, butylene glycol di(meth)acrylate, neopentyl glycol di(meth)acrylate, tris(2-hydroxyethyl)isocyanurate di(meth)acrylate, tris(2-hydroxyethyl)isocyanurate tri(meth)acrylate, tricyclodecane dimethanol di(meth)acrylate, epoxy (meth)acrylate prepared by adding (meth)acrylic acid to diglycidyl ether of bisphenol A, bisphenol A di(meth)acryloyloxy ethyl ether, bisphenol A di(meth)acryloyloxy methyl ethyl ether, bisphenol A di(meth)acryloyloxy ethyl oxy ethyl ether, pentaerythritol tri(meth)acrylate, pentaerythritol tetra(meth)acrylate, dipentaerythritol penta(meth)acrylate, dipentaerythritol hexa(meth)acrylate, and polyester (meth)acrylates (tri- or higher functional).

As the compound (B), a commercially available compound(s) may be used as it is/they are. Examples of the commercially available compounds include ARONIX M-210, ARONIX M-309, ARONIX M-310, ARONIX M-320, ARONIX M-400, ARONIX M-7100, ARONIX M-8030, ARONIX M-8060, ARONIX M-8100, ARONIX M-9050, ARONIX M-240, ARONIX M-245, ARONIXM-6100, ARONIXM-6200, ARONIXM-6250, ARONIXM-6300, ARONIX M-6400, and ARONIX M-6500 (these are manufactured by Toagosei Co., Ltd.); KAYARAD R-551, KAYARAD R-712, KAYARAD TMPTA, KAYARAD HDDA, KAYARAD TPGDA, KAYARAD PEG400DA, KAYARAD MANDA, KAYARAD HX-220, KAYARAD HX-620, KAYARAD R-604, KAYARAD DPCA-20, DPCA-30, KAYARAD DPCA-60, and KAYARAD DPCA-120 (these are manufactured by Nippon Kayaku Co., Ltd.); and Viscoat #295, Viscoat #300, Viscoat #260, Viscoat #312, Viscoat #335HP, Viscoat #360, Viscoat #GPT, Viscoat #3PA, and Viscoat #400 (these are manufactured by Osaka Organic Chemical Industry Ltd.).

As the compound (B), these compounds may be used singly, or in combination of two or more kinds thereof.

The amount of the compound (B) used is usually 10 to 100 parts by mass, preferably 30 to 80 parts by mass with respect to 100 parts by mass of the alkali-soluble resin (A). In cases where the amount of the compound (B) used is within this range, the compound (B) and the alkali-soluble resin (A) show excellent compatibility, and the coating liquid composed of the photosensitive resin composition has improved shelf stability. Moreover, the photosensitive resin film has good exposure sensitivity.

[Photo Radical Polymerization Initiator Having Oxime Ester Structure (C)]

The photo radical polymerization initiator having an oxime ester structure (C) is a compound that generates radicals by light irradiation to initiate radical polymerization of the compound (B). As described above, the photo radical polymerization initiator (C) generates a large amount of various active species. As a result, the photo radical polymerization initiator (C) has a function to suppress the inhibition by oxygen in the air.

Although the photo radical polymerization initiator having an oxime ester structure (C) may contain geometric isomers due to the double bond of the oxime, these isomers are not distinguished from each other, and any of the geometric isomers may be included in the photo radical polymerization initiator (C).

Examples of the photo radical polymerization initiator (C) include the photo radical polymerization initiators described in WO 2010/146883, JP 2011-132215 A, Japanese Translated PCT Patent Application Laid-open No. 2008-506749, Japanese Translated PCT Patent Application Laid-open No. 2009-519904, and Japanese Translated PCT Patent Application Laid-open No. 2009-519991.

Specific examples of the photo radical polymerization initiator (C) include N-benzoyloxy-1-(4-phenylsulfanylphenyl)butane-1-one-2-imine, N-ethoxycarbonyloxy-1-phenylpropane-1-one-2-imine, N-benzoyloxy-1-(4-phenylsulfanylphenyl)octane-1-one-2-imine, N-acetoxy-1-[9-ethyl-6-(2-methylbenzoyl)-9H-carbazol-3-yl]ethane-1-imine, and N-acetoxy-1-[9-ethyl-6-{2-methyl-4-(3,3-dimethyl-2,4-dioxacyclopentanylmethyloxy)benzoyl}-9H-carbazol-3-yl]ethane-1-imine.

The oxime ester structure in the photo radical polymerization initiator (C) is preferably a structure represented by Formula (2) below.

[Formula (2)]

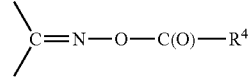

(2)

In Formula (2), R$^4$ represents an optionally substituted alkyl group or an optionally substituted aryl group.

Examples of the alkyl group include methyl group, ethyl group, and propyl group. Examples of the aryl group include phenyl group, naphthyl group, anthracenyl group, fluorenyl group, and pyrenyl group.

In Formula (2), 2 organic groups are bound to the carbon atom at the left end. Examples of the organic groups include alkyl groups; and groups having an aryl group(s) such as the phenylcarbazole group and the phenylthiobenzoyl group.

In cases where the photo radical polymerization initiator (C) has the structure represented by Formula (2) as the oxime ester structure, the inhibition by oxygen can be efficiently prevented, and therefore a resist pattern having excellent resolution can be formed.

Preferred examples of the photo radical polymerization initiator (C) include a compound having a structure in which an oxime ester structure is bound to a phenylcarbazole group, and a compound represented by Formula (6) below.

[Formula (6)]

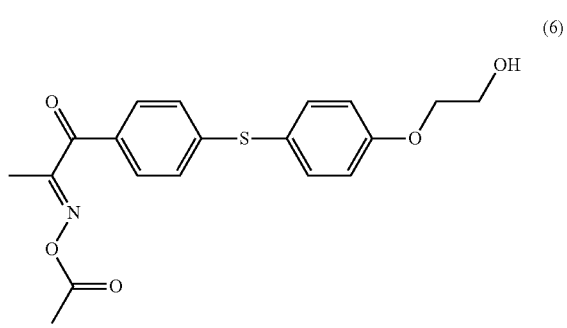

Examples of the compounds having a structure in which the oxime ester structure represented by Formula (2) is bound to a carbazole group include the compounds represented by the Formulae (3) and (4) below.

[Formula (3)]

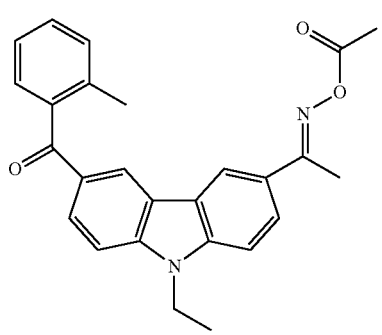

[Formula (4)]

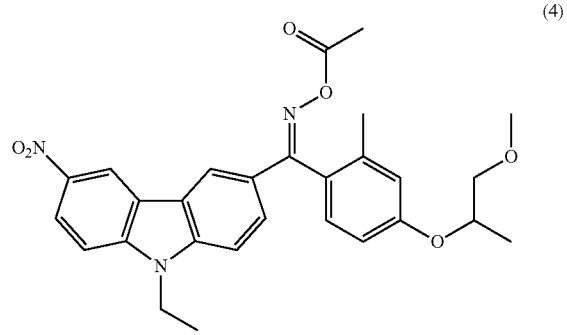

As the photopolymerization initiator (C), these compounds may be used singly, or in combination of two or more kinds thereof.

The content of the photo radical polymerization initiator (C) in the photosensitive resin composition is 3 to 20 parts by mass, preferably 3 to 15 parts by mass, more preferably 4 to 10 parts by mass with respect to 100 parts by mass of the alkali-soluble resin (A). In cases where the content of the photo radical polymerization initiator (C) is within this range, a resist pattern having excellent resolution can be formed.

The ratio of the photo radical polymerization initiator (C) having an oxime ester structure in the whole photo radical polymerization initiator contained in the photosensitive resin composition of the present invention is usually not less than 5% by mass, preferably not less than 10% by mass, more preferably not less than 20% by mass.

[Photo Radical Polymerization Initiator Other than Photo Radical Polymerization Initiator (C)]

The photosensitive resin composition of the present invention may contain, as an arbitrary component, a photo radical polymerization initiator other than the photo radical polymerization initiator having an oxime ester structure (C), in order to control the shape and the sensitivity of the resist pattern.

Examples of the photo radical polymerization initiator other than the photo radical polymerization initiator (C) include biimidazole compounds, acylphosphine oxide compounds, alkylphenone compounds, triazine compounds, benzoin compounds, and benzophenone compounds. Examples of the biimidazole compounds include 2,2'-bis(2, 4-dichlorophenyl)-4,5,4',5'-tetraphenyl-1,2'-biimidazole, 2,2'-bis(2-chlorophenyl)-4,5,4',5'-tetraphenyl-1,2'-biimidazole, 2,2'-bis(2,4-dichlorophenyl)-4,5,4',5'-tetraphenyl-1,2'-biimidazole, 2,2'-bis(2,4-dimethylphenyl)-4,5,4',5'-tetraphenyl-1,2'-biimidazole, 2,2'-bis(2-methylphenyl)-4,5,4',5'-tetraphenyl-1,2'-biimidazole, and 2,2'-diphenyl-4,5,4',5'-tetraphenyl-1,2'-biimidazole.

Examples of the alkylphenone compounds include diethoxyacetophenone, 2-hydroxy-2-methyl-1-phenylpropane-1-one, benzyldimethylketal, 2-hydroxy-1-[4-(2-hydroxyethoxy)phenyl]-2-methylpropane-1-one, 2-methyl-1-(4-methylthiophenyl)-2-morpholinopropane-1-one, 2-benzyl-2-dimethylamino-1-(4-morpholinophenyl)butane-1-one, 2-methyl-1-[4-(methylthio)phenyl]-2-morpholinopropane-1-one, 2-(2-methylbenzyl)-2-dimethylamino-1-(4-morpholinophenyl)butanone, 2-(3-methylbenzyl)-2-dimethylamino-1-(4-morpholinophenyl)butanone, 2-(4-methylbenzyl)-2-dimethylamino-1-(4-morpholinophenyl)butanone, 2-(2-ethylbenzyl)-2-dimethylamino-1-(4-morpholinophenyl)butanone, 2-(2-propylbenzyl)-2-dimethylamino-1-(4-morpholinophenyl)butanone, and 2-(2-butylbenzyl)-2-dimethylamino-1-(4-morpholinophenyl)butanone.

Examples of the acylphosphine oxide compounds include 2,4,6-trimethylbenzoyldiphenylphosphine oxide.

Examples of the triazine compounds include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl) ethenyl]-1,3,5-triazine, and 2,4-bis(trichloromethyl)-6-[2-(3,4-dimethoxyphenyl)ethenyl]-1,3, 5-triazine.

Examples of the benzoin compounds include benzoin, benzoin methyl ether, benzoin ethyl ether, benzoin isopropyl ether, and benzoin isobutyl ether.

Examples of the benzophenone compounds include benzophenone, o-benzoyl methyl benzoate, 4-phenylbenzophenone, 4-benzoyl-4'-methyldiphenylsulfide, 3,3',4,4'-bis(diethylamino)benzophenone, 4,4'-tetra(tert-butylperoxycarbonyl)benzophenone, and 2,4,6-trimethylbenzophenone.

As the photo radical polymerization initiator other than the photopolymerization initiator (C), these compounds may be used singly, or in combination of two or more kinds thereof.

[Other Components]

If necessary, the photosensitive resin composition of the present invention may contain, in addition to the above-described components, solvents, polymerization inhibitors, surfactants, adhesion aids for improvement of the adhesiveness between the resin film and the substrate, sensitizers for increasing the sensitivity, inorganic fillers for improvement of the strength of the resin film, light absorbents, and the like, as long as these components do not deteriorate the object or properties of the present invention.

The light absorbents are compounds that absorb light having a wavelength corresponding to the exposure light. Inclusion of a light absorbent allows formation of a resist pattern that absorbs leakage light and has a rectangular cross section and excellent resolution.

(Light Absorbent)

Examples of the light absorbent include organic light absorbents and inorganic light absorbents such as zinc oxide and titanium oxide. Among these light absorbents, organic light absorbents are preferred.

Examples of the organic light absorbents include curcumine based light absorbents, azo based light absorbents, aminoketone based light absorbents, xanthene based light absorbents, quinoline based light absorbents, aminoketone based light absorbents, anthraquinone based light absorbents, benzophenone based light absorbents, diphenyl cyanoacrylate based light absorbents, triazine based light absorbents, p-aminobenzoic acid based light absorbents, and biimidazole based light absorbents. Among these organic light absorbents, biimidazole based light absorbents are preferred from the viewpoint of absorbance and affinity for other components.

Examples of the biimidazole based light absorbents include 2,2'-bis(2,4-dichlorophenyl)-4,5,4',5'-tetraphenyl-1,2'-biimidazole, 2,2'-bis(2-chlorophenyl)-4,5,4',5'-tetraphenyl-1,2'-biimidazole, 2,2'-bis(2,4-dichlorophenyl)-4,5,4',5'-tetraphenyl-1,2'-biimidazole, 2,2'-bis(2,4-dimethylphenyl)-4,5,4',5'-tetraphenyl-1,2'-biimidazole, 2,2'-bis(2-methylphenyl)-4,5,4',5'-tetraphenyl-1,2'-biimidazole, and 2,2'-diphenyl-4,5,4',5'-tetraphenyl-1,2'-biimidazole.

The content of the light absorbent in the photosensitive resin composition is usually 0.01 to 5 parts by mass, preferably 0.01 to 3.0 parts by mass, more preferably 0.5 to 2.0 parts by mass with respect to 100 parts by mass of the alkali-soluble resin (A). In cases where the content of the light absorbent is within this range, a resist pattern having a rectangular cross section can be formed.

As the light absorbent, the above compounds may be used singly, or in combination of two or more kinds thereof.

(Solvent)

Inclusion of a solvent in the photosensitive resin composition of the present invention allows improvement of ease of handling, control of the viscosity, and improvement of the shelf stability of the photosensitive resin composition.

Examples of the solvent include alcohols such as methanol, ethanol, and propylene glycol;

cyclic ethers such as tetrahydrofuran and dioxane;

glycols such as ethylene glycol and propylene glycol;

alkylene glycol monoalkyl ethers such as ethylene glycol monomethyl ether, propylene glycol monomethyl ether, and propylene glycol monoethyl ether;

alkylene glycol monoalkyl ether acetates such as ethylene glycol monomethyl ether acetate, propylene glycol monomethyl ether acetate, and propylene glycol monoethyl ether acetate;

aromatic hydrocarbons such as toluene and xylene;

ketones such as acetone, methyl ethyl ketone, methyl isobutyl ketone, cyclohexanone, and 4-hydroxy-4-methyl-2-pentanone;

esters such as ethyl acetate, butyl acetate, ethyl ethoxyacetate, ethyl hydroxyacetate, ethyl 2-hydroxypropionate, ethyl 2-hydroxy-2-methylpropionate, methyl 2-hydroxy-3-methylbutanoate, methyl 3-methoxypropionate, ethyl 3-methoxypropionate, ethyl 3-ethoxypropionate, methyl 3-ethoxypropionate, and ethyl lactate; and N-methylformamide, N,N-dimethylformamide, N-methylformanilide, N-methylacetoamide, N,N-dimethylacetoamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, γ-butyrolactone, ethylene carbonate, propylene carbonate, and phenyl cellosolve acetate.

The amount of ethylene glycol solvent used in the present invention is preferably not less than 50% by mass, more preferably not less than 80% by mass with respect to 100% by mass of the whole solvent. By use of an ethylene glycol-based solvent(s) as the solvent within this range, resin films having largely different film thicknesses can be more easily formed.

In cases where a resin film having a film thickness of 5 to 100 μm is to be formed, the content of the solvent is usually not less than 50 parts by mass, preferably 60 to 300 parts by mass, more preferably 80 to 200 parts by mass with respect to 100 parts by mass of the alkali-soluble resin (A).

(Polymerization Inhibitor)

Although the alkali-soluble resin (A) has polymerization inhibitory action as described above, the photosensitive resin composition of the present invention may further contain a polymerization inhibitor.

Examples of the polymerization inhibitor include pyrogallol, methylene blue, tert-butylcatechol, monobenzyl ether, amylquinone, amyloxyhydroquinone, phenol, n-butylphenol, p-methoxyphenol, hydroquinone monopropyl ether, 4,4'-(1-methylethylidene)bis(2-methylphenol), 4,4'-(1-methylethylidene)bis(2,6-dimethylphenol), 4,4'-[1-[4-(1-(4-hydroxyphenyl)-1-methylethyl)phenyl]ethylidene]bisphenol, 4,4',4''-ethylidenetris(2-methylphenol), 4,4',4''-ethylidenetrisphenol, and 1,1,3-tris(2,5-dimethyl-4-hydroxyphenyl)-3-phenylpropane.

(Surfactant)

Inclusion of a surfactant in the photosensitive resin composition allows improvement of the coating properties, defoaming properties, leveling properties, and the like.

As the surfactant, a commercially available surfactant may be used. Specific examples of the commercially available surfactant include NBX-15, FTX-204D, FTX-208D, FTX-212D, FTX-216D, FTX-218, FTX-220D, and FTX-222D (these are manufactured by Neos Company, Ltd.); BM-1000 and BM-1100 (these are manufactured by B. M. Chemie Co., Ltd.); Megaface F142D, Megaface F172, Megaface F173, and Megaface F183 (these are manufactured by DIC Corporation); Fluorad FC-135, Fluorad FC-170C, Fluorad FC-430, and Fluorad FC-431 (these are manufactured by Sumitomo 3M Limited); Surflon S-112, Surflon S-113, Surflon S-131, Surflon S-141, and Surflon S-145 (these are manufactured by Asahi Glass Co., Ltd.); and SH-28PA, SH-190, SH-193, SZ-6032, and SF-8428 (these are manufactured by Toray, Dow Corning Silicone, Co., Ltd.). Among these, FTX-216D, FTX-218, and FTX-220D are preferred.

<Method for Preparing Photosensitive Resin Composition>

The photosensitive resin composition of the present invention can be prepared by uniformly mixing the components. In addition, in order to remove impurities, the mixture obtained by uniformly mixing the components may be filtered through a filter and/or the like.

[Method for Producing Resist Pattern]

The method for producing a resist pattern of the present invention at least comprises the steps of: applying the photosensitive resin composition to a base material to form a resin coating (hereinafter referred to as Step (1)); exposing the resin coating (hereinafter referred to as Step (2)); and developing the exposed resin coating using an alkaline developer to allow pattern formation (hereinafter referred to as Step (3)).

[Step (1)]

The base material is not limited as long as the resin coating can be formed therewith. Examples of the base material include semiconductor substrates, glass substrates, silicon substrates, and substrates formed by providing a metal coating or the like on the surface of a glass plate, silicon plate, or semiconductor plate. The shape of the base material is not limited. The base material may be in the form of a flat plate, or may be in the form of a plate in which a recess(es) (hole(s)) is/are provided such as the base material (silicon wafer) used in the later-mentioned Examples. In cases of a base material in which a recess(es) is/are provided and which has a copper film on its surface, the bottom of each recess may be provided with the copper film as in the TSV structure.

The method for applying the photosensitive resin composition is not limited, and examples of the method include spraying, roll coating, spin coating, slit die coating, bar coating, and ink jet method. Spin coating is especially preferred. In cases of spin coating, the rotation speed is usually 800 to 3000 rpm, preferably 800 to 2000 rpm, and the rotation time is usually 1 to 300 seconds, preferably 5 to 200 seconds. After the spin coating with the resin composition, the obtained coating is dried under heat at, for example, 50 to 250° C. for about 1 to 30 minutes.

The film thickness of the resin coating is usually 0.1 to 50 μm, preferably 0.5 to 30 μm, more preferably 1 to 20 μm, still more preferably 2 to 10 μm. The thinner the film, the more remarkable the inhibition by oxygen appears. Thus, in cases where the photosensitive resin composition of the present invention is used for the purpose of preparing a plated product, the composition is preferably used within the above-described range.

[Step (2)]

In Step (2), the resin film is selectively exposed such that a resist pattern can be obtained. For the selective exposure, the resin film is exposed usually through a desired photomask using, for example, a contact aligner, stepper, or scanner. As the exposure light, a light having a wavelength of 200 to 500 nm (e.g., i-line (365 nm)) is used. The exposure energy varies depending on the types and the amounts of the components contained in the resin film, the thickness of the coating, and the like. In cases where i-line is used as the exposure light, the exposure energy is usually 1000 to 100,000 mJ/m$^2$.

Heat treatment may be carried out after the exposure. The conditions for the heat treatment after the exposure may be appropriately determined depending on the types and the amounts of the components contained in the resin film, the thickness of the coating, and the like. The heat treatment is usually carried out at 70 to 180° C. for 1 to 60 minutes.

[Step (3)]

In Step (3), the resin film after the exposure is brought into contact with an aqueous alkaline solution. That is, development is performed in Step (3). In Step (3), the unexposed portion of the resin film is dissolved with a developer while the exposed portion is kept undissolved, to obtain a cured film having a predetermined pattern.

Examples of the developer that may be employed include aqueous solutions of sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo [5.4.0]-7-undecene, and 1,5-diazabicyclo [4.3.0]-5-nonane. An aqueous solution prepared by adding an appropriate amount(s) of a water-soluble organic solvent(s) such as methanol and ethanol, and a surfactant(s), to the aqueous alkali solution may also be used as the developer.

The developing time varies depending on the types and the mixing ratios of the components contained in the composition, the thickness of the coating, and the like. The developing time is usually 30 to 600 seconds. The method of the development may be any of liquid application, dipping, puddling, spraying, shower development, and the like.

Additional curing of the thus prepared cured film may be carried out, depending on its use, by performing additional exposure (hereinafter referred to as "post-exposure") and/or heating.

The post-exposure can be carried out by the same method as in the above exposure. The exposure energy is not limited, and, in cases where a high pressure mercury lamp is used, the exposure energy is preferably 1,000 to 100,000 mJ/m$^2$. The heating may be carried out by heat treatment using a heating device such as a hot plate or oven at a predetermined temperature of, for example, 60 to 100° C., for a predetermined time of, for example, 5 to 30 minutes on a hot plate or 5 to 60 minutes in an oven. By this post treatment, a cured film having a pattern with even better properties can be obtained.

The patterned resin film may be washed with running water or the like. Thereafter, the resin film may be dried in the air using an air gun or the like, or dried under heat using a hot plate, oven, or the like.

[Method for Producing Metallic Pattern]

By the method for producing a metallic pattern of the present invention, the resist pattern formed by the above-described method for forming a resist pattern is used as a mask to produce the metallic pattern.

Specifically, the resist pattern formed on the substrate is used as a mask for performing plating process such as electrolytic plating, etching, or the like to produce the metallic pattern on the substrate.

In the method for producing a metallic pattern of the present invention, a metallic pattern having a rectangular cross section can be easily produced by using electrolytic plating. Examples of the metallic pattern include bumps.

EXAMPLES

The present invention is described below more concretely by way of Examples. However, the present invention is not limited to these Examples. In the following description of the Examples and the like, "part" represents "part by mass" unless otherwise stated.

Method for Measuring Weight Average Molecular Weight (Mw) of Polymer

The Weight Average Molecular Weight (Mw) was measured by gel permeation chromatography under the following conditions.

Column: Columns manufactured by Tosoh Corporation, TSK-M and TSK2500, linearly connected
Solvent: Tetrahydrofuran
Temperature: 40° C.
Detection method: Refractive index method
Reference substance: Polystyrene
GPC device: Device name "HLC-8220-GPC", manufactured by Tosoh Corporation Production of Photosensitive Resin Composition Examples 1 to 3, and Comparative Examples 1 to 3

The mixture of 100 parts of an alkali-soluble resin (Mw: 8,000) that has a structural unit assigned with a sign (a) (hereinafter referred to as the structural unit (a)), a structural unit assigned with a sign (b) (hereinafter referred to as the structural unit (b)), and a structural unit assigned with a sign (c) (hereinafter referred to as the structural unit (c)), all of which are represented in Formula (5) below, or has the structural unit (a) and the structural unit (c), in which the content ratio of these structural units are shown in Table 1; 70 parts of polyester acrylate (trade name, "ARONIX M-8060"; manufactured by Toagosei Co., Ltd.); 0.1 parts of a diglycerin ethylene oxide adduct (average addition mole number: 18) of perfluorononenyl ether ("Ftergent FTX-218", manufactured by Neos Company, Ltd.); and 6 parts of a compound represented by Formula (6) below; and 265 parts of propylene glycol monomethyl ether acetate was uniformly mixed to produce the photosensitive resin compositions of the Examples 1 to 3 and the Comparative Examples 1 to 3. The resolution and adhesiveness of these photosensitive resin compositions were evaluated as described below.

[Formula (5)]

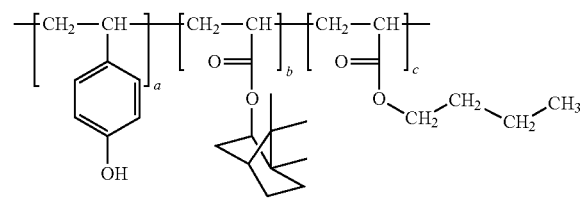

(5)

[Formula (6)]

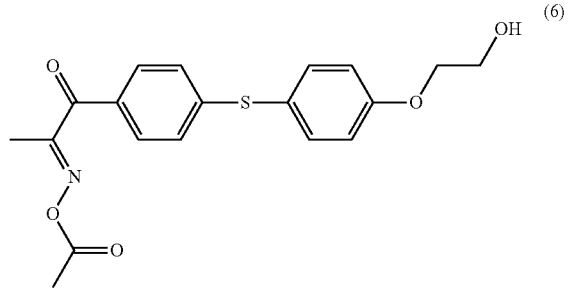

(6)

the substrate was then heated on a hot plate at 90° C. for 3 minutes to form a resin film having a thickness of 5 μm. Subsequently, the resin film was exposed using a stepper (manufactured by Nikon Corporation, type "NSR-2005i10D") through a pattern forming mask having a line width of 4 μm and a pitch of 8 μm with the exposure energy and the focal point varied. The resin film after the exposure was brought into contact with 2.38% by mass aqueous tetramethyl ammonium hydroxide solution for 45 seconds, and then washed with running water, followed by performing nitrogen blow to form a resist pattern. The size and shape of the resist pattern were observed by electron microscope.

In the same manner, the resin film was exposed through a pattern forming mask having a line width of 2 μm and a pitch of 4 μm with the exposure energy and the focal point varied. The resin film after the exposure was brought into contact with 2.38% by mass aqueous tetramethyl ammonium hydroxide solution for 45 seconds, and then washed with running water, followed by performing nitrogen blow to form a resist pattern. The size and shape of the resist pattern were observed by electron microscope.

The resolution was evaluated based on the following criteria. The results of the evaluation are shown in Table 1. A: The resist pattern having a line width of 2 μm could be resolved so as to have a rectangular cross section. B: The resist pattern having a line width of 4 μm could be resolved so as to have a rectangular cross section, but the resist pattern having a line width of 2 μm could not be resolved so as to have a rectangular cross section. C: Neither the resist pattern having a line width of 2 μm nor the resist pattern having a line width of 4 μm could be resolved so as to have a rectangular cross section.

Adhesiveness

In the same manner as the evaluation of the resolution, a resin film was formed. In the formation of the resist pattern in the evaluation of the resolution, the exposure energy with which the resist pattern having a line width of 2 μm was formed was regarded as the optimal exposure energy. Using the focal point with which the resist pattern having a line width of 2 μm was formed with the optimal exposure energy, the resin film was exposed while lowering the exposure energy from the optimal exposure energy. The resin film after the exposure was treated in the same manner as the evaluation of the resolution to form a resist pattern. The resist pattern was observed by electron microscope.

The adhesiveness was evaluated based on the following criteria. The results of the evaluation are shown in Table 1.
A: The resist pattern having a line width of 1.6 μm didn't collapse.

TABLE 1

|  |  | Example 1 | Example 2 | Example 3 | Comparative Example 1 | Comparative Example 2 | Comparative Example 3 |
|---|---|---|---|---|---|---|---|
| Content ratio of structural units of alkali-soluble resin (% by mass) | a | 50 | 60 | 40 | 30 | 70 | 80 |
|  | b | 30 | 20 | 40 | 50 | 10 | 0 |
|  | c | 20 | 20 | 20 | 20 | 20 | 20 |
| Resolution |  | A | A | A | B | C | C |
| Adhesiveness |  | A | A | B | C | A | A |

Evaluation of Photosensitive Resin Composition

The photosensitive resin compositions were evaluated by the following method.

Resolution

To a substrate having a copper sputtering film on a silicon plate, each composition was applied using a spin coater, and B: The resist pattern having a line width of 2 μm didn't collapse, but the resist pattern having a line width of not less than 1.6 μm and less than 2 μm collapsed.

C: The resist pattern having a line width of not less than 2 μm collapsed.

What is claimed is:

1. A photosensitive resin composition comprising:
an alkali-soluble resin (A) having more than 30% by mass and less than 70% by mass of a structural unit represented by Formula (1) below:

[Formula (1)]

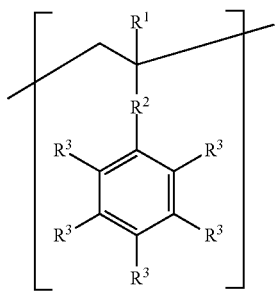
(1)

wherein, in Formula (1), $R^1$ represents a hydrogen atom or a $C_{1-4}$ alkyl group, $R^2$ represents a single bond or a divalent organic group, and one of $R^3$ is a hydroxyl group and the remaining $R^3$ are hydrogen atoms;
a compound (B) having at least one ethylenically unsaturated double bond per molecule; and
a photo radical polymerization initiator (C) having an oxime ester structure; wherein
a content of the photo radical polymerization initiator (C) with respect to 100 parts by mass of the alkali-soluble resin (A) is 3 to 20 parts by mass.

2. The photosensitive resin composition according to claim 1, wherein $R^2$ in Formula (1) is a single bond.

3. The photosensitive resin composition according to claim 1, wherein the oxime ester structure is a structure represented by Formula (2) below:

[Formula (2)]

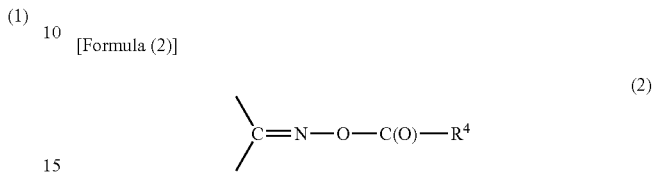
(2)

wherein, in Formula (2), $R^4$ represents an optionally substituted alkyl group or an optionally substituted aryl group.

4. A method for forming a resist pattern, comprising the steps of:
(1) applying the photosensitive resin composition according to claim 1 to a base material to form a resin coating;
(2) exposing the resin coating; and
(3) developing the exposed resin coating using an alkaline developer to allow pattern formation.

5. A method for producing a metallic pattern by using the resist pattern formed by the method for forming a resist pattern according to claim 4 as a mask.

* * * * *